(12) United States Patent
Gotsick et al.

(10) Patent No.: US 7,247,344 B2
(45) Date of Patent: Jul. 24, 2007

(54) METHOD AND APPARATUS FOR APPLYING SURFACE TREATMENTS TO PHOTOSENSITIVE PRINTING ELEMENTS DURING THERMAL DEVELOPMENT

(76) Inventors: Timothy Gotsick, 1681 Kenbrook Trace, Acworth, GA (US) 30101; Ryan Vest, 3420 Canyon Oak Way, Cumming, GA (US) 30041

( * ) Notice: Subject to any disclaimer, the term of this patent is extended or adjusted under 35 U.S.C. 154(b) by 90 days.

(21) Appl. No.: 10/990,087

(22) Filed: Nov. 16, 2004

(65) Prior Publication Data

US 2006/0105109 A1    May 18, 2006

(51) Int. Cl.
   *B05D 1/28*    (2006.01)
(52) U.S. Cl. .................. 427/144; 427/177; 427/314; 427/402; 427/429; 101/401.1; 118/60; 118/264
(58) Field of Classification Search ........... 427/429, 427/144
   See application file for complete search history.

(56) References Cited

U.S. PATENT DOCUMENTS

| | | | |
|---|---|---|---|
| 3,745,028 A | 7/1973 | Rauner | |
| 4,202,696 A | 5/1980 | Takahashi et al. | |
| 4,452,879 A | 6/1984 | Fickes et al. | |
| 4,603,058 A | 7/1986 | Adams | |
| 4,680,251 A | 7/1987 | Schober | |
| 4,690,821 A | 9/1987 | Smith et al. | |
| 4,725,528 A | 2/1988 | Koch et al. | |
| 4,925,775 A | 5/1990 | Hoffmann | |
| 5,124,237 A | 6/1992 | Littmann et al. | |
| 5,175,072 A | 12/1992 | Martens | |
| 5,262,275 A | 11/1993 | Fan | |
| 5,279,697 A * | 1/1994 | Peterson et al. | 156/358 |
| 5,564,337 A * | 10/1996 | Uehara et al. | 101/408 |
| 5,798,019 A * | 8/1998 | Cushner et al. | 156/425 |
| 5,856,066 A | 1/1999 | Yoshida et al. | |
| 5,925,500 A | 7/1999 | Yang et al. | |
| 6,030,751 A | 2/2000 | Ellis et al. | |
| 6,238,837 B1 | 5/2001 | Fan | |
| 6,355,395 B1 | 3/2002 | Zwez et al. | |
| 6,403,284 B1 | 6/2002 | Yoshida | |
| 6,490,424 B2 * | 12/2002 | Okamoto | 399/101 |
| 6,605,410 B2 | 8/2003 | Yang et al. | |
| 6,756,193 B2 | 6/2004 | Katoh | |
| 6,797,454 B1 | 9/2004 | Johnson et al. | |
| 2002/0164494 A1 | 11/2002 | Grant et al. | |

FOREIGN PATENT DOCUMENTS

WO    WO 01/18604 A2    3/2001

* cited by examiner

*Primary Examiner*—Katherine Bareford
(74) *Attorney, Agent, or Firm*—Carmody & Torrance LLP

(57) ABSTRACT

The present invention is directed to a method and an apparatus for applying a surface treatment composition to a photosensitive printing element during thermal processing. A photosensitive printing element is contacted with a web of absorbent material that is capable of absorbing material that is melted or softened from an imaged and exposed surface of a photosensitive printing element. The web of absorbent material is coated with a surface treatment composition to transfer the surface treatment composition from the web of absorbent material to the imaged and exposed surface of the photosensitive printing element. Applying the surface treatment composition during thermal processing provides for more complete and more uniform coverage of the surface treatment composition on the photosensitive printing element.

16 Claims, 2 Drawing Sheets

METHOD AND APPARATUS FOR APPLYING SURFACE TREATMENTS TO PHOTOSENSITIVE PRINTING ELEMENTS DURING THERMAL DEVELOPMENT

FIELD OF THE INVENTION

The present invention is an apparatus and method for applying surface treatment compositions to photosensitive printing elements during thermal development of the photosensitive printing element.

BACKGROUND OF THE INVENTION

Systems for thermal development of flexographic printing plates are well known in the art. A typical system for thermal development of flexographic printing plates comprises a plate processor that accepts a previously formed and imagewise actinic radiation exposed flexible sheet. The flexible sheet typically has a base layer and one or more adjacent layers of a radiation hardenable elastomer material (curable layer). Optionally, an infrared sensitive layer may be present on top of the radiation-curable layer.

U.S. Pat. No. 5,175,072 to Martens, the subject matter of which is herein incorporated by reference in its entirety, describes a method for forming, irradiating, and thermally developing a flexographic sheet to produce a flexographic printing plate. Thermal development plate processors are further described in U.S. Pat. No. 5,279,697 to Peterson et al., and in WO 01/18604 to Johnson et al., the subject matter of each of which is herein incorporated by reference in its entirety. The plate processor described by Johnson et al. is similar to the plate processor described by Peterson et al.

Prior to using the plate processor to thermally develop the flexible sheet to form the flexographic printing plate, the flexographic printing plate is subjected to an imaging step. In a typical imaging step, a template or mask is first placed over the radiation-curable layer, which is imagewise exposed to actinic radiation to harden (cure or crosslink) a portion of the radiation curable layer. Alternatively, a laser ablatable layer may be ablated by a laser to create an in situ mask on the radiation-curable layer. A portion of the radiation-curable layer is then cured by actinic radiation through the lower surface of the base to form a cured "floor." Next, the radiation-curable layer is imagewise exposed from the opposite surface to cure the desired portions of the plate. The radiation-curable layer after curing consists of cured portions and uncured portions. At this point, the flexible sheet may be developed in the thermal plate processor to remove uncured portions of the printing plate, revealing the relief image on the printing plate.

The development of the relief structure formed during the imaging step is accomplished by removal of the uncured portions of the radiation-curable layer. In the thermal development process, the radiation-curable layer is contacted with a heated web of absorbent material. The heat in the absorbent web is transferred to the radiation curable layer upon contact, and the temperature of the radiation-curable layer is raised to a temperature sufficient to enable the uncured portions of the radiation-curable layer to soften or liquefy and be absorbed into the absorbent web. While still in the heated condition, the absorbent sheet material is separated from the cured radiation-curable layer in contact with the support layer to reveal the relief structure. After cooling to room temperature, the resulting flexographic printing plate can be mounted on a printing plate cylinder.

After the developing step, conventional post-treatment steps including post-exposure and detackification can be utilized.

The post-exposure step in the plate-making process is a step of irradiating the resin cured product after the development with actinic radiation, aiming mainly at accelerating the mechanical strength and removing the surface tackiness. As an example of the post-exposure step, an actinic radiation source having a wavelength distribution in a range of 300 nm or (for example, high pressure mercury vapor lamp, ultra-high pressure mercury vapor lamp, ultraviolet fluorescent lighting, carbon arc lamp, xenon lamp or the like) and an actinic radiation source having a wavelength distribution in the range of from 200 to 300 nm (for example, low pressure mercury vapor lamp, germicidal lamp, deuterium lamp or the like) are used in combination.

Surface tackiness of the printing plate can cause various problems in the printing process, including poor workability during the process of attaching the plate to and detaching the plate from the plate cylinder, adhesion of plates to each other or attachment of dust to the plates during the storing of the plates, adhesion of paper powder to the plate and paper-picking during the printing, etc. In particular, when paper powder adhesion and the paper-picking result from the tackiness of the plate during the printing, it is necessary to discontinue the printing and clean the plate, and the working efficiency of the plate is markedly decreased. One example of a surface-treating solution that can reduce surface tackiness is described in U.S. Pat. No. 6,403,284 to Yoshida, and comprises a hydrogen-abstracting agent contained in an aqueous surface active agent solution. Various after treatment solutions can also be utilized, such as those described in U.S. Pat. No. 5,124,237 to Littmann et al. and U.S. Pat. No. 4,725,528 to Koch et al.

Other surface treatments for flexographic printing are commonly applied manually after processing, and are used to aid in printing performance and longevity. Examples include Armor All® and other silicone emulsions. Surface treatments may be desired for various reasons including to increase resistance to ozone or UV degradation, to change surface properties that may affect ink acceptance or release, or to affect other changes in plate properties or processing characteristics that improve plate performance.

When printing plates are exposed to the air in a standard printing room, particularly in the warmer months of the year, ozone present in the air can cause cracking of the relief surface. Ozone cracking is manifested generally by the initial appearance of short, deep cracks perpendicular to the direction of curvature of the plate, i.e., across the cylinder. These cracks may start on the printing surface, but when cracking is severe, the cracks go over the edge of the relief surface onto the floor of the printing plate. The thicker the plate, the more readily it cracks because of the grater stress caused by wrapping the plate around the printing cylinder. Severe cracks can damage the plate sufficiently to render it useless for printing. In order to prevent plates from cracking, U.S. Pat. No. 4,452,879 to Fickes et al. suggests the use of a dithiocarbamate solution that is applied to a dried relief surface of the printing plate.

High ozone concentrations can also cause difficulties when flexible packaging materials such as paper, cardboard, and plastic films are printed on. In order to obtain sufficient adhesion of the printing ink to the plastic film, the films may be pretreated with electrical spark discharge, which produces significant quantities of ozone. Because this pretreatment is most effective when applied immediately before the printing process, it is unavoidable that the flexographic printing plates are exposed to ozone. In this instance, ozone protection may be provided by applying a treating material such as a liquid polyether, to the printing plate, as described in U.S. Pat. No. 4,680,251 to Schober. The application of the treating material onto the printing plate may be carried out manually by using a cotton swab, sponge or brush, or by dipping the printing plate into a bath. The polyether can also be applied mechanically by spraying or rinsing.

After the printing plate has been exposed imagewise and developed, non-image areas may be desensitized by adding a thin, tightly adhering film of a hydrophilic colloid, such as a gum. This hydrophilic film (desensitizer gum) acts as a barrier to prevent ink from sensitizing the non-image areas of the plate. The desensitizer gum is typically applied with a cotton pad and a rubber squeegee used to remove excess gum and ready the plate for printing. The use of desensitizing gums is discussed, for example, in U.S. Pat. No. 3,745,028 to Rauner with respect to lithographic printing plates.

As demonstrated by the above discussion, a variety of surface treatment compositions, may be applied to relief image printing plates to improve properties of the printing plate. However, many of these surface treatment compositions are applied manually, resulting in uneven application of the surface treatment composition. Furthermore, most, if not all of the application methods require an additional step, thus requiring additional time and an additional apparatus.

To that end, further improvements are needed to more efficiently and uniformly apply surface treatment compositions to relief image printing plates to improve the quality of such plates. The inventors have discovered that a thermal processing system used to develop the relief image of the photosensitive printing element can advantageously be used to apply a variety of surface treatment compositions uniformly and automatically to the surface of relief image printing plates.

SUMMARY OF THE INVENTION

It is an object of the present invention to provide an improved means for applying surface treatment compositions to imaged and exposed surfaces of photosensitive printing elements to improve surface qualities of such printing elements.

It is another object of the present invention to provide a more efficient process for uniformly applying such surface treatment compositions to the photosensitive printing elements.

To that end, the present invention is directed to an improved apparatus for applying a surface treatment composition to a photosensitive printing element during thermal processing.

The system of the invention generally comprises:

an apparatus for applying a surface treating composition to an imaged and exposed surface of a photosensitive printing element during thermal processing, the apparatus comprising:

means for supporting the photosensitive printing element;

means for softening or melting non-crosslinked photopolymer on the imaged and exposed surface of the photosensitive printing element;

at least one roll that is contactable with the imaged and exposed surface of the photosensitive printing element, wherein at least a portion of the surface of the at least one roll that is contactable with the imaged and exposed surface of the photosensitive printing element is covered with a web of absorbent material that is capable of absorbing material that is melted or softened from the imaged and exposed surface of the photosensitive printing element, and wherein the web of absorbent material is coated with a surface treating composition that is capable of being transferred from the web of absorbent material to the imaged and exposed surface of the photosensitive printing element; and means for maintaining contact between the at least one roll and the imaged and exposed surface of the photosensitive printing element;

wherein when the web of absorbent material contacts at least a portion of the imaged and exposed surface of the photosensitive printing element, at least a portion of the surface treating composition on the web of absorbent material is transferred to at least a portion of the imaged and exposed surface of the photosensitive printing element.

The invention is also directed to a method of applying a surface treating composition to an imaged and exposed surface of a photosensitive printing element during thermal processing, the method comprising the steps of:

supporting the photosensitive printing element on a supporting means;

melting or softening non-crosslinked photopolymer on the imaged and exposed surface of the photosensitive printing element;

causing contact between the imaged and exposed surface of the photosensitive printing element and at least one roll, wherein at least a portion of the at least one roll that is contactable with the imaged and exposed photosensitive printing element is covered with a web of absorbent material that is capable of absorbing material that is melted or softened from the imaged and exposed surface of the photosensitive printing element, wherein the web of absorbent material is coated with a surface treating composition that is transferable from the web of absorbent material to the imaged and exposed surface of the photosensitive printing element; and maintaining contact between the at least one roll and the imaged and exposed surface of the photosensitive printing element;

wherein when the web of absorbent material contacts at least a portion of the imaged and exposed surface of the photosensitive printing element, the surface treating composition is transferred from the web of absorbent material to at least the portion of the imaged and exposed surface of the photosensitive printing element.

DETAILED DESCRIPTION OF THE INVENTION

The present invention is directed to an apparatus for applying a surface treating composition to an imaged and exposed surface of a photosensitive printing element during thermal processing.

The system of the invention accepts a previously formed and imagewise actinic radiation exposed flexible photosensitive printing element the photosensitive printing element having a base layer and an adjacent layer of a radiation hardenable elastomer material (curable layer). Optionally, the photosensitive printing element may contain a laser ablatable layer, which is used to form an in situ mask on the curable layer using laser radiation prior to exposure to actinic radiation. Suitable photosensitive printing elements usable in the invention are described in U.S. Pat. No. 5,175,072 to Martens, U.S. Pat. Nos. 5,262,275 and 6,238,837 to Fan, and U.S. Pat. Nos. 5,925,500 and 6,605,410 to Yang et al., the subject matter of each of which is herein incorporated by reference in its entirety.

A portion of the radiation curable layer is preferably cured by actinic radiation through the lower surface of the base to form a cured "floor." Next, the film is imagewise exposed from the opposite surface to cure the desired portions of the plate, preferably through a negative or the in situ mask. The remaining portion of the radiation curable layer after curing consists of cured portions and uncured portions.

Photosensitive printing elements processible in the invention can be substantially planar or can be cylindrical printing sleeves.

Figure 1:
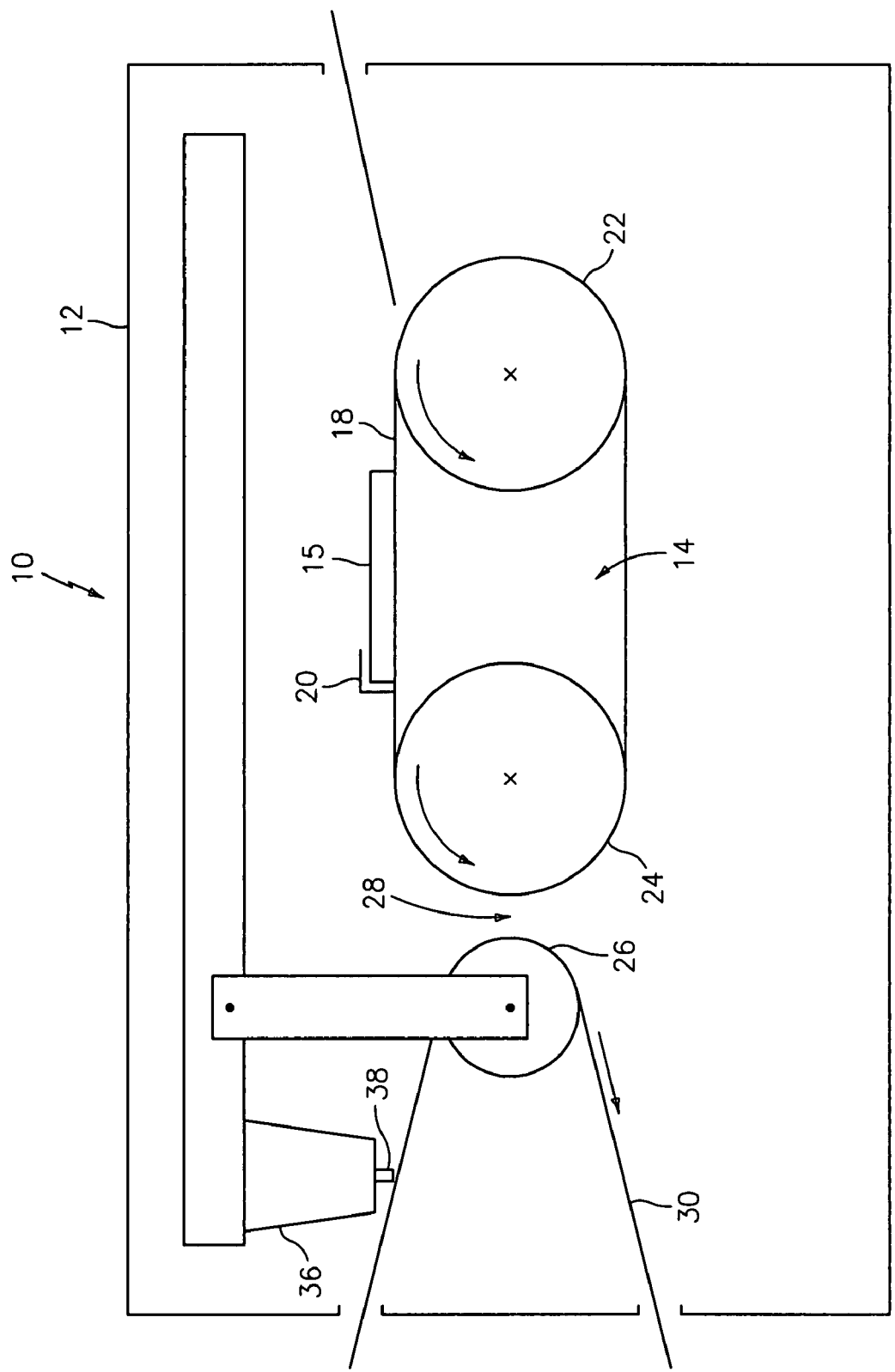
FIG. 1 depicts a view of a plate processor in accordance with one embodiment of the present invention.

FIG. 1 depicts one embodiment of the claimed invention in which substantially planar photosensitive printing elements are processed. As seen in FIG. 1, the system 10 may optionally, but preferably, comprise an enclosure 12 for housing the elements of the thermal plate processing system 10.

The thermal processing system 10 comprises means 14 for supporting the photosensitive printing element 15, which in this embodiment may be a conveyor 14 having a continuous loop 18 supported by at least a first roller 22 and a second roller 24. The first roller 22 and the second roller 24 rotate to advance the photosensitive printing element 15 on the continuous loop 18 of the conveyor 14 towards at least one roll 26. Optionally, one or more additional rollers (not shown) may be used to provide additional support to the conveyor 14 and prevent the continuous loop 18 from sagging from the weight of the photosensitive printing element 15. In a preferred embodiment, the continuous loop 18 comprises wire mesh.

The leading edge of the photosensitive printing element 15 may be held in place against the continuous loop 18 of the conveyor 14 by suitable fastening means 20, such as a clamp and/or vacuum. If desired, a vacuum may be provided to at least one of the first roller 22 and the second roller 24 of the conveyor 14, and used, alone or in combination with fastening means 20, to hold the photosensitive printing element 15 in place on the continuous loop 18 of the conveyor 14.

The apparatus of the invention also comprises means for softening or melting non-crosslinked photopolymer on the imaged and exposed surface of the photosensitive printing element 15, which may be a heated roll or an external heating source, and is discussed in more detail below.

In a preferred embodiment of the invention, the means for melting or softening non-crosslinked photopolymer on the imaged and exposed surface of the photosensitive printing element 15 comprises heating the at least one roll 26 that contacts the imaged and exposed surface of the photosensitive printing element 15. If a heatable roll is used, heat is provided to the at least one roll 26 by a core heater that is capable of maintaining a skin temperature on the at least one roll 26 sufficient to soften or melt at least a portion of the photosensitive material. The temperature to which the at least one roll 26 is heated is chosen based on the composition of the photosensitive material and is based on the melting temperature of the monomers and polymers contained within the photosensitive material. Although the at least one roll 26 preferably comprises an electrical core heater to provide the desired skin temperature, the use of steam, oil, hot air, and a variety of other heating sources may also provide the desired skin temperature.

In another embodiment, external heating means 60 (shown in FIG. 2) may be used to apply heat to the imaged and exposed surface of the photosensitive printing element 15. If used, the external heating means 60 are typically positioned adjacent to a point where the web of absorbent material 30 contacts the imaged and exposed surface of the photosensitive printing element 15. The external heating means 60 may also be used with the heated at least one roll 26 to provides an auxiliary heat source to further soften and melt non-crosslinked material on the imaged and exposed surface of the photosensitive printing element 15.

The at least one roll 26 that is contactable with the imaged and exposed surface of the photosensitive printing element 15 is covered with a web of absorbent material 30 that is capable of absorbing material that is melted or softened from the imaged and exposed surface of the photosensitive printing element 15, and wherein the web of absorbent material 30 is coated with a surface treating composition that is capable of being transferred from the web of absorbent material 30 to the imaged and exposed surface of the photosensitive printing element 15.

The web of absorbent material 30 comes into face-to-face contact with the at least one roll 26, which in the preferred embodiment is heated to and operated at a temperature between about 150° C. and about 250° C. The upper limit is determined in large part by the melting temperature of the web of absorbent material 30, however, the upper limit will also be governed by the treating solution being applied. The temperature of the heatable roller 26 must also be low enough so that when the web of absorbent material 30 is not moving and the portions of the web of absorbent material 30 contacting the heatable roller 26 are at rest, the absorbent material 30 does not melt and the treating solution is not affected (i.e., that the treating solution does not degrade).

Figure 2:
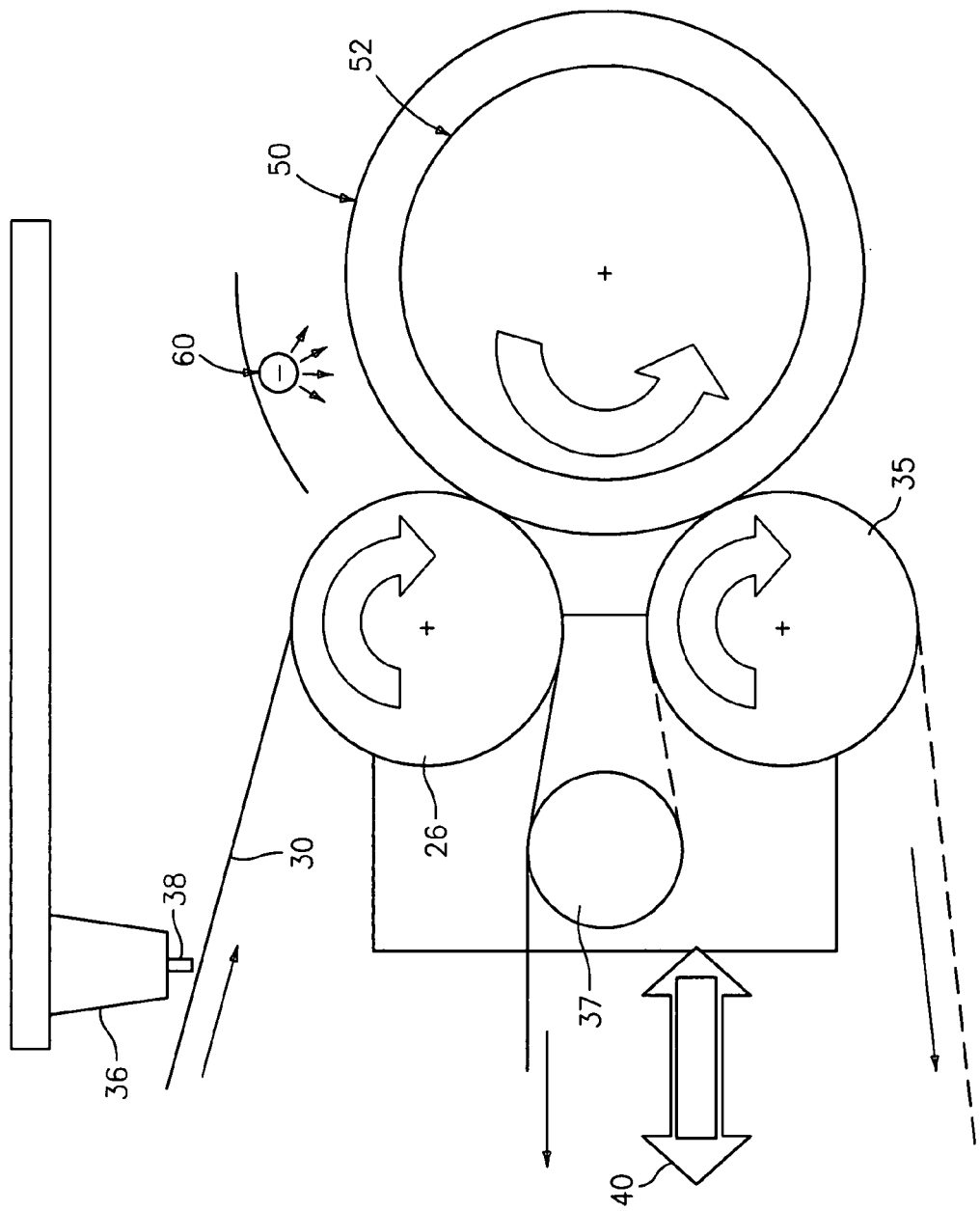
FIG. 2 depicts a view of a plate processor in accordance with another embodiment of the invention.

Finally, the apparatus of the invention comprises means for maintaining contact between the at least one roll 26 and the imaged and exposed surface of the photosensitive printing element 15. As shown in FIG. 2, the means for maintaining contact between the at least one roll 26 and the photosensitive printing element 15 may comprise suitable means, such as one or more pneumatic cylinders 40. The pneumatic cylinder(s) 40 position the at least one roll 26 at a preset distance from the imaged and exposed surface of the photosensitive printing element 15.

During operation, when the web of absorbent material contacts at least a portion of the imaged and exposed surface of the photosensitive printing element, at least a portion of the surface treating composition on the web of absorbent material is transferred to at least a portion of the imaged and exposed surface of the photosensitive printing element.

As depicted in FIG. 2, the photosensitive printing element may be a cylindrical printing sleeve 50. In this instance, the means for supporting the photosensitive printing element 50 is a sleeve mandrel 52 and the cylindrical printing sleeve 50 is mounted on the sleeve mandrel 52. The sleeve mandrel 52 with the photosensitive printing element 50 mounted thereon rotates towards the at least one roll 26. In addition, as seen in FIG. 2, the at least one roll 26 may further comprise a second roll 35 and a tracking roll 37 which is used to self-center the at least one roll 26 and the second roll 35 against the cylindrical printing sleeve 50.

The use of the web of absorbent material 30 to remove melted or softened uncrosslinked photopolymer is an integral part of the thermal processing of photosensitive printing elements. In addition to simply serving as a medium for removing melted or softened photopolymer, the web of absorbent material 30 can also serve as a unique vehicle for applying a surface treatment to a photosensitive printing element 15. Because the web of absorbent material 30 is in intimate contact with both the photopolymer material that is being removed and the cured photopolymer material which remains to form the printing surface, a treatment substance can be transferred from the web of absorbent material 30 to the printing (relief) surface of the photosensitive printing element 15 well as the floor (non-printing) portion of the printing element when the web of absorbent material 30 contacts the printing surface during processing. Because the web of absorbent material 30 directly contacts the photosensitive printing element 15, a surface treatment composition may advantageously be applied to the web of absorbent material 30 so that when the web of absorbent material 30 contacts at least a portion of the photosensitive printing element 15, the surface treatment composition is transferred from the web of absorbent material 30 to at least the portion of the photosensitive printing element 15.

The means for supplying the web of absorbent material 30 to the at least one roll 26 typically comprises a supply roll (not shown) of the web of absorbent material 30 that is continuously fed to and looped around at least the portion of the at least one roll 26 that contacts the imaged and exposed surface of the photosensitive printing element 15. In addition, a take-up roll (not shown) may be used for rewinding web of absorbent material 30 that contains the melted or softened material that is removed from the imaged and exposed surface of the photosensitive printing element 15. If present, the take-up roller is independently belt driven by a motor, which is preferably a variable speed motor. The take-up roller collects the web of absorbent material 30 after it has contacted the photosensitive printing element 15 and removed portions of the photosensitive material that were melted or softened.

The specific type of absorbent material is not critical to the present invention. The selection of the absorbent material 30 depends in part upon the thickness of the photosensitive printing element 15 to be processed, the melting temperature of the web of absorbent material 30, and the heat transfer characteristics of both the photosensitive printing element 15 and the web of absorbent material 30. In addition, the selection of the web of absorbent material 30 depends on the specific treatment solution that is applied to the web of absorbent material 30. The web of absorbent material 30 is typically selected from the group consisting of paper, woven fabrics, and non-woven fabrics.

Surface treatment compositions that can be applied using the system of the instant invention may be liquid, solid, or gaseous, with the application method being optimized to suit each type of material. Suitable surface treatment compositions would generally be well known to those skilled in the art. Some examples of surface treatment compositions that can be applied by the process of the invention include silicone emulsions, liquid polyethers, and desensitizing gums.

Surface treatment compositions useful in this invention can be designed to address various functional attributes such as ozone resistance, anti-static agents, ultra violet protectants, surface active agents or surfactants, detackification or slip agents and the like. Surface treatment compositions useful herein to promote ozone resistance include waxes, aromatic amines such as N,N-diphenyl-p-phenylenediamine, quinoline, and furan derivatives. Anti-static agents include quaternary ammonium compounds, fatty amines and phosphate esters. Ultra violet light protectors include benzophenones, benzotriazalis, and substituted acrylonitriles. The surface energy of the printing plate can be increased by the application of surfactants, detergents, fatty acids, and glycols. Surface energy can be decreased by the application of silicones, waxes and fluorinated polymers or monomers. These surface treatment compositions may be applied using the method of this invention alone or in combinations and neat or in solution.

In one embodiment of the invention, the web of absorbent material 30 is pre-coated with the surface treatment composition. In another embodiment of the invention, a reservoir 36 that contains the surface treatment composition is positioned between the means for supplying the web of absorbent material and the at least one roll 26. The reservoir 36 is operatively connected to an applicator 38 for continuously applying the surface treatment composition to the web of absorbent material 30.

The invention is also directed to a method of applying a surface treating composition to an imaged and exposed surface of a photosensitive printing element during thermal processing, comprising the steps of:

supporting the photosensitive printing element on a supporting means;

melting or softening non-crosslinked photopolymer on the imaged and exposed surface of the photosensitive printing element;

causing contact between the imaged and exposed surface of the photosensitive printing element and at least one roll, wherein at least a portion of the at least one roll that is contactable with the imaged and exposed photosensitive printing element is covered with a web of absorbent material that is capable of absorbing material that is melted or softened from the imaged and exposed surface of the photosensitive printing element, wherein the web of absorbent material is coated with a surface treating composition that is transferable from the web of absorbent material to the imaged and exposed surface of the photosensitive printing element; and maintaining contact between the at least one roll and the imaged and exposed surface of the photosensitive printing element;

wherein when the web of absorbent material contacts at least a portion of the imaged and exposed surface of the photosensitive printing element, the surface treating composition is transferred from the web of absorbent material to at least the portion of the imaged and exposed surface of the photosensitive printing element.

It would be apparent to one skilled in the art that the means for supporting the photosensitive printing element 15, as well as the at least one roll 26 are driven by suitable means, i.e., a motor. A controller, such as a microprocessor may also be used in the system of the invention to control the operation of each of the elements in the plate processor 10. Such controllers are well known in the art. One example of a controller used to control the various elements in a plate processor is described in U.S. Pat. No. 5,279,697 to Peterson et al., the subject matter of which is herein incorporated by reference in its entirety.

The photosensitive printing element may be processed through the steps of the process several times so that most, if not all of the uncured photosensitive material can be removed from the surface of the photosensitive printing element to obtain the relief image and so that complete coverage of the imaged and exposed surface of the photosensitive printing element by the treating composition may be obtained.

What is claimed is:

1. A method of applying a surface treating composition to an imaged and exposed surface of a photosensitive printing element during thermal processing, the method comprising the steps of:
   supporting the photosensitive printing element on a supporting means;
   melting or softening non-crosslinked photopolymer on the imaged and exposed surface of the photosensitive printing element;
   causing contact between the imaged and exposed surface of the photosensitive printing element and a web of absorbent material that is supported by at least a portion of at least one roll at the point of contact and is capable of absorbing non-crosslinked photopolymer that is melted or softened from the imaged and exposed surface of the photosensitive printing element wherein the web of absorbent material is coated with a surface treating composition that is transferable from the web of absorbent material to the imaged and exposed surface of the photosensitive printing element; and
   maintaining contact between the web of absorbent material on the at least one roll and the imaged and exposed surface of the photosensitive printing element;
   wherein the non-crosslinked photopolymer on the imaged and exposed surface of the photosensitive printing element is softened by heating the at least one roll that supports the web at the point of contact between the web and the imaged and exposed surface of the photosensitive printing element, wherein the at least one roll is heated to and operated at a temperature of between about 150 and about 250° C.;
   wherein when the web of absorbent material contacts at least a portion of the imaged and exposed surface of the photosensitive printing element, the web of absorbent material absorbs the melted or softened non-crosslinked photopolymer from the imaged and exposed surface of the photosensitive printing element and the surface treating composition is transferred from the web of absorbent material to at least the portion of the imaged and exposed surface of the photosensitive printing element.

2. The method according to claim 1, wherein the web of absorbent material is continuously supplied to at least one roll from a supply roll of the web of absorbent material.

3. The method according to claim 2, further comprising the step of rewinding the web of absorbent material that contains melted or softened non-crosslinked photopolymer that is removed from the imaged and exposed surface of the photosensitive printing element onto a take-up roller.

4. The method according to claim 2, wherein the photosensitive printing element is supported on a conveyor comprising a continuous loop supported by at least a first roller and a second roller.

5. The method according to claim 4, wherein at least the first roller and the second roller rotate in a direction towards the at least one roll to move the photosensitive printing element on the continuous loop towards the at least one roll.

6. The method according to claim 4, wherein the photosensitive printing element is held in place on the continuous loop of the conveyor by a clamp or vacuum.

7. The method according to claim 1, wherein the photosensitive printing element is substantially planar.

8. The method according to claim 1, wherein the photosensitive printing element is a cylindrical printing sleeve and the cylindrical printing sleeve is mounted on a sleeve mandrel.

9. The method according to claim 8, wherein the sleeve mandrel with the photosensitive printing element mounted thereon rotates towards the at least one roll.

10. The method according to claim 1, wherein the web of absorbent material is selected from the group consisting of paper, woven fabrics, and non-woven fabrics.

11. The method according to claim 1, wherein the surface treating composition is selected from the group consisting of silicone emulsions, liquid polyethers, and desensitizing gums.

12. The method according to claim 1, wherein the web of absorbent material is pre-coated with the surface treatment composition.

13. The method according to claim 1, wherein the surface treatment composition is coated onto the web of absorbent material before the web of absorbent material is supplied to at least one roll.

14. The method according to claim 13, comprising the step of applying the surface treatment composition to the web of absorbent material using an applicator.

15. The method according to claim 14, wherein the surface treatment composition is supplied to the applicator from a reservoir that contains the surface treatment composition.

16. The method according to claim 1, further composing the step of applying heat to the at least one layer of photosensitive material by positioning a heater adjacent to a point where the web of absorbent material contacts at least the portion of the imaged and exposed surface of the photosensitive printing element.

* * * * *